United States Patent
Chiang

(10) Patent No.: US 8,220,143 B2
(45) Date of Patent: Jul. 17, 2012

(54) METHOD FOR A PLASTIC LEAD FRAME WITH REFLECTIVE AND CONDUCTIVE LAYER

(75) Inventor: Cheng-Feng Chiang, Gueishan Township, Taoyuan County (TW)

(73) Assignee: Kuang Hong Precision Co., Ltd, Taoyuan County (TW)

( * ) Notice: Subject to any disclaimer, the term of this patent is extended or adjusted under 35 U.S.C. 154(b) by 10 days.

(21) Appl. No.: 12/470,759

(22) Filed: May 22, 2009

(65) Prior Publication Data

US 2010/0294538 A1    Nov. 25, 2010

(51) Int. Cl.
*H01R 43/00* (2006.01)
*C23C 28/00* (2006.01)

(52) U.S. Cl. .............. 29/825; 29/827; 29/829; 29/832; 29/831; 29/846; 205/183

(58) Field of Classification Search .......... 29/825, 29/846, 847, 832, 831, 827, 829; 205/164, 205/205, 187, 183, 184; 219/121.69, 212.67, 219/212.68; 257/99, 100, 101, 102; 438/106, 438/118, 122, 123
See application file for complete search history.

(56) References Cited

U.S. PATENT DOCUMENTS

| | | | |
|---|---|---|---|
| 5,832,600 A * | 11/1998 | Hashimoto | 29/841 |
| 6,406,934 B1 * | 6/2002 | Glenn et al. | 438/106 |
| 6,707,069 B2 * | 3/2004 | Song et al. | 257/79 |
| 6,883,231 B2 * | 4/2005 | Igarashi et al. | 29/840 |
| 6,943,379 B2 * | 9/2005 | Suehiro et al. | 257/99 |
| 2007/0257272 A1 * | 11/2007 | Hutchins | 257/98 |
| 2008/0160317 A1 * | 7/2008 | Haitko | 428/413 |
| 2009/0159320 A1 * | 6/2009 | Sanjuan et al. | 174/260 |

* cited by examiner

*Primary Examiner* — Derris Banks
*Assistant Examiner* — Tai Nguyen
(74) *Attorney, Agent, or Firm* — Chun-Ming Shih

(57) ABSTRACT

A plastic lead frame with reflection and conduction metal layer includes a base made of a metal catalyst containing or an organic substance containing plastic material, the base further includes a slanted reflection surface formed downwardly on top of the base; an insert slot continuously and staggeringly formed along the circumferential fringe of the base; a molded carrier made of non-metallic catalyst or organic substance containing plastic material accommodated in the insert slot; an interface layer formed on the surface of the base by chemical deposition; an insulation route formed on the surface of the base by ablating part of the interface layer with the laser beam radiation; and a metallic layer formed on the base by electroplating process thereby forming a plastic lead frame of excellent electrical conductivity and high light reflection property.

10 Claims, 6 Drawing Sheets

METHOD FOR A PLASTIC LEAD FRAME WITH REFLECTIVE AND CONDUCTIVE LAYER

BACKGROUND OF THE INVENTION

1. Field of the Invention

The present invention relates to a plastic lead frame and the fabrication method of same, in particular, to a plastic lead frame with high reflection efficiency, enlarged conductive area and high heat conductivity, and its simple and low cost fabrication process.

2. Description of the Prior Art

Usually, the LED lead frame is normally made of conductive sheet materials such as copper, copper alloy or aluminum by punch process to form a basic material of the lead frame, afterwards the surface of the basic material is electroplated to form a layer of high conductive metal using Sn, Ag or Au, finally it is formed into a cup shaped LED lead frame by the process of insert molding. However, it is regretful that the reflection area of the cup shaped lead frame fabricated as such fails to provide an effective reflection with its metal layer.

Alternatively, process of Laser Direct Structuring (LDS) can be applied to the fabrication of the LED lead frame, but it is disadvantageous that the specially designated material is needed to carry out this process so as to activate the surface of the electrodes and the reflection area with laser beams, by so, the surface thereof is granulated by laser, and the area to be radiated by laser is too large, the tilted surface of the conductor frame work receives less laser beams, and the time is limited to carry out the process, all these factors added to result in a deviation of the actual refection direction and the reflection luminance from the originally expected value. Besides, to run 3 dimensional laser machining equipment is quite expensive, it requires too long operation time, so that the production cost will be excessively high.

Another selection is the low temperature co-fired ceramics (LTCC). As the ceramic resembles with silicon in its property so that it can be connected with an electronic chip, it has a high heat conductivity and high refractory property. However, the LTCC process is carried out with a temperature of about 900° C. which brings about a non-uniform shrinking causing variation in electric property of the product. Besides, it is expensive to carry out LTCC process that causes the difficulty for mass production with a reduced cost.

There are manufactures that have intended to fabricate the lead frame by applying two-shot molding technique. Presently there are two selections, namely PCK and SKW. In PCK process, the plastic material which being electroplated and modified by the catalyst is employed at first time, then a non-electroplating plastic is employed in second time, after that the surface of the work piece is activated by etching and metalizing. As for SKW process, an electroplatable plastic material is used in molding at first time, then followed by etching the surface of the plastic material formed in the preceding process, and activating the surface thereof with Pd. Afterwards the work piece is placed in the mold for the second time molding and then metalizing the surface thereof. The aforesaid two methods are inappropriate to apply for machining a very fine and sophisticated wiring by reason that such a very fine and sophisticated wiring can not be effectively finished by employing two-shot molding technique.

In other words, presently the manufacturers have encountered difficulty in fabrication of the conventional complicated LED lead frame causing them unable to lower the production cost. The granulated surface resulted after the laser beam radiation is unable to acquire the desired reflection direction, luminance and efficiency, inapplicable to form an insulation route pattern with micromachining, all these flaws have to be solved. It is a paramount importance to develop a technique capable of fabricating a LED lead frame with the excellent characteristics such as high reflectivity and can be made easily with a low production cost for the benefit of both manufacturers and users.

In view of the foregoing situation, the inventor of the present invention herein has gone to great lengths by conducting an intensive research based on many years of experience gained through professional engagement in the manufacturing of related products, with continuous experimentation and improvement culminating in the development of the improved structure of the plastic lead frame with reflection and conduction metal layers, and the fabrication method thereof.

SUMMARY OF THE INVENTION

It is an object of the present invention to provide a plastic lead frame with reflection and conduction metal layers, which can improve the efficiency of reflection and form a fine insulation route pattern on the lead frame.

It is another object of the present invention to provide the fabrication method for a plastic lead frame with reflection and conduction metal layers with which the plastic lead frame can be fabricated with a simple process and less production cost so as to promote mass production.

To achieve the aforesaid object, the plastic lead frame according to the present invention comprises a base made of metal catalyst containing or an organic substance containing plastic material. A carrier molded of non-metallic catalyst or organic substance containing plastic material is accommodated in an insertion slot continuously and staggeringly formed along the circumferential edge of the base. There is a slanted reflection surface formed on the top of the base, and a metallic interface layer is formed on the surface of the base by chemical deposition of copper or nickel, and then an insulation route is formed by ablating part of the interface layer by laser beam radiation. Finally electroplating process using the metals Cu, Ni, Ag, or Au makes up the plastic lead frame with reflection and conduction metal layers.

The fabrication method of same comprises the following steps.

1. Two-shot molding: precision machining performs A two-shot mold. A base is made of a metal catalyst containing plastic material or an organic substance containing plastic material, and a carrier firmly attached to the base is formed with a non-metallic catalyst containing or its organic substance containing plastic material, and a slanted reflection surface is formed downwardly on the top of the base so as to make a fundamental material for the lead frame.

2. Chemical deposition: After making the fundamental material for the lead frame, a pretreatment for bath electroplating is carried out successively to partially activate the surface, and a metallic interface layer is formed on the surface of the base by chemical deposition of copper or nickel.

3. Insulation route forming by laser beam radiation: After forming the interface layer by chemical plating and deposition, an insulation route is formed by ablating part of the interface layer by laser beam radiation.

4. Electroplating: Finally the plastic lead frame with reflection and conduction metal layers is made up by electroplating process using Cu, Ni, Ag, and Au.

BRIEF DESCRIPTION OF THE DRAWINGS

The drawings disclose the illustrative embodiments of the present invention which serve to exemplify the various advantages and objects hereof, and are as follows.

DETAILED DESCRIPTION OF THE PREFERRED EMBODIMENTS

Figure 1:
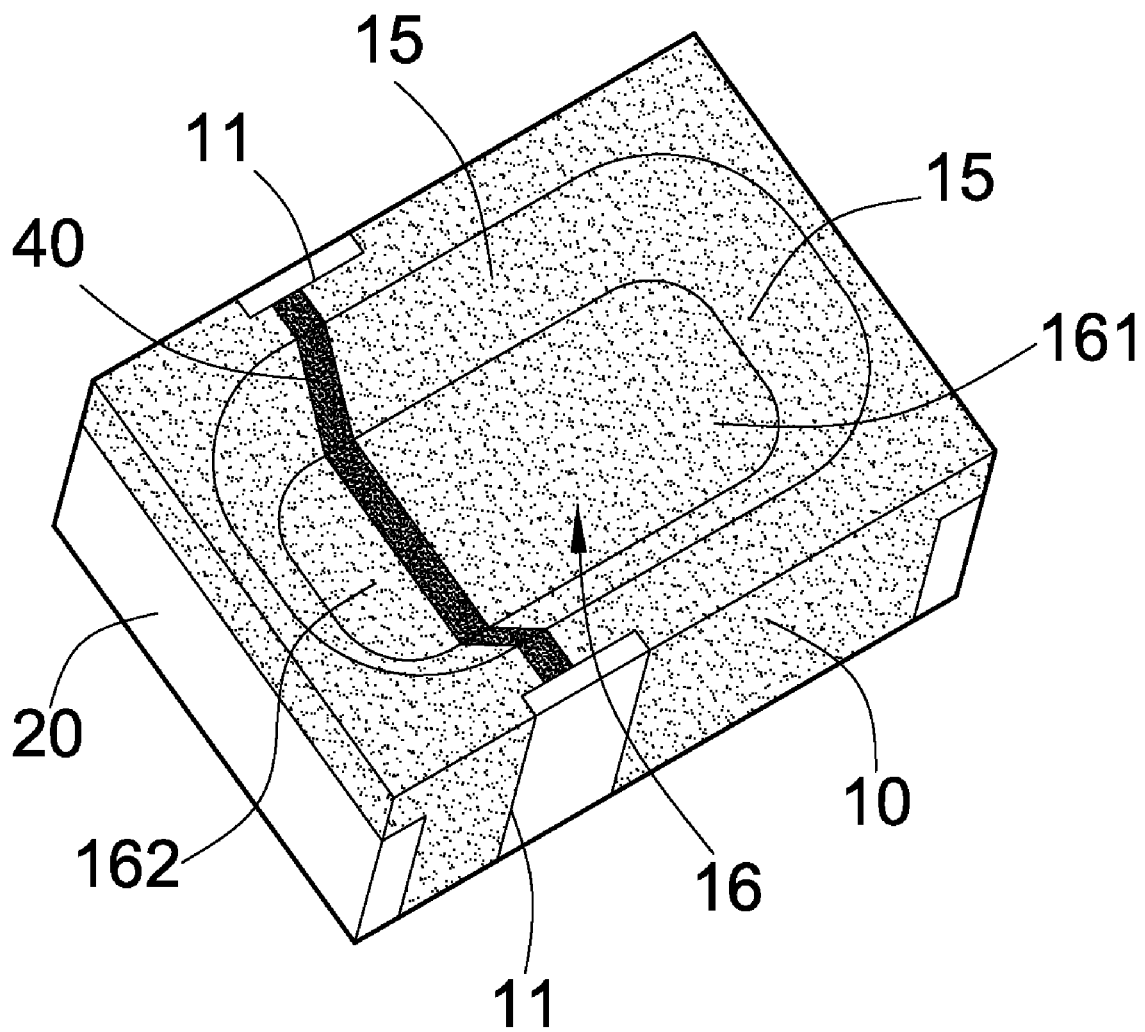
FIG. 1 is a prospective view of the plastic material lead frame of the present invention for illustrating the structure thereof and the mutual relation among the component parts.

The present invention relates to a plastic lead frame and the fabrication method of same. The front and rear, right and left, top and bottom, upper and lower, horizontal and vertical views depicted in the drawings are provided for purposes of reference and explanation and shall not be construed as limitation applicable to the invention herein in any position or direction. All sizes and dimensions designated in the drawings and the specification can be varied or modified according the actual needs without departing from the scope of the appended claims. Incidentally, the product provided by the present invention is not only applicable as a lead frame for LED, but also for other electronic components.

Referring to FIG. 1, the plastic lead frame of the present invention, a base 10 is made of a metal catalyst containing or an organic substance containing plastic material, and an insert slot 11 is continuously and staggeringly formed along the circumferential fringe of the base 10 so as to accommodate a carrier 20 made of non-metallic catalyst or organic substance plastic material with two-shot molding. A slanted reflection surface 15 and an accommodation cavity 16 for LEDS are formed downwardly on the top of the base 10. The curvature of this reflection surface 15 (generally called by the name of reflection cup) can be optionally determined. The angle formed between the top surface of the base 10 and the slanted reflection surface 15 is at the range of 15°~85°, usually 15° according to the actual requirement for improving the efficiency of light emission. Furthermore, an interface layer 30 is formed on the surface of the base 10 by chemically depositing copper or nickel, and forming an insulation route 40 on the surface of the base 10 by ablating part of the interface layer 30 with the laser beam radiation so as to divide the accommodation cavity 16 into a positive pole 161 and a negative pole 162. Finally the reflection efficiency of the reflection surface 15 is upgraded by applying pure metals such as Cu, Ni, Ag, Au, Cr on it by electroplating process thereby completing fabrication of the plastic lead frame having a conductive metallic layer 50 of electric conduction and light reflection. A lead frame fabricated as such is applicable to LEDS of unlimited numbers; the reflection surface 15 on the base 10 of the lead frame can be formed into any desirable figure to allow arraying a plurality of LEDS on it. The interface layer 30 formed of chemical deposition can serve excellent electrical characteristic, high optical reflectivity and high heat conductivity with low production cost.

Figure 2:
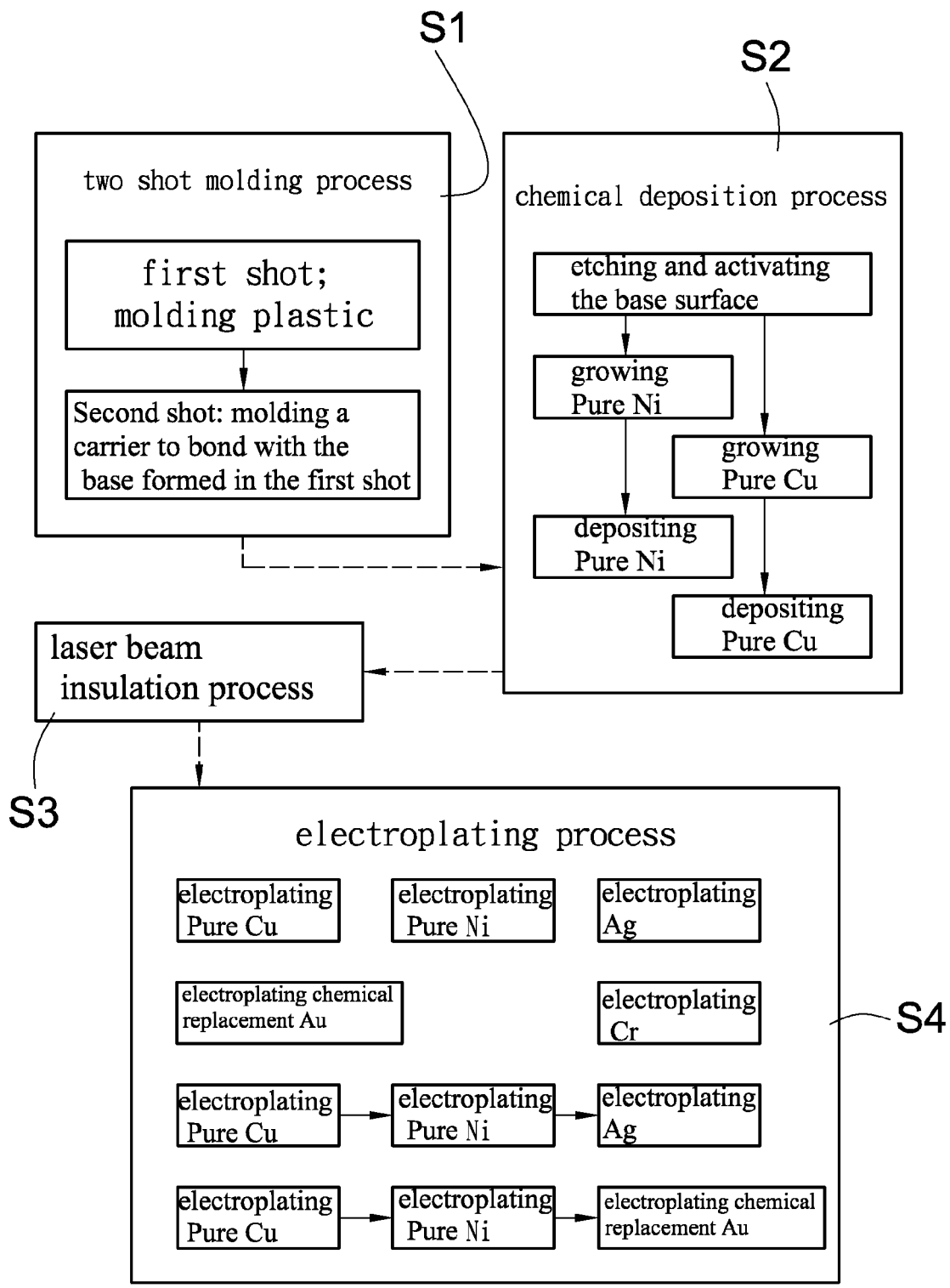
FIGS. 2 and 3 are block diagrams for illustration the flow of the TSMPL fabrication process for the plastic material lead frame according to two embodiments of the present invention.

Referring to FIG. 2, in an embodiment of method for fabrication the plastic lead frame according to the present invention, four steps, i.e. Two-shot molding S1, chemical deposition S2, insulation route forming by laser beam radiation S3, and electroplating S4 are included. This fabrication method is defined as Two-Shot Molded Plating and Laser (TSMPL) process in the present invention.

Figure 4:
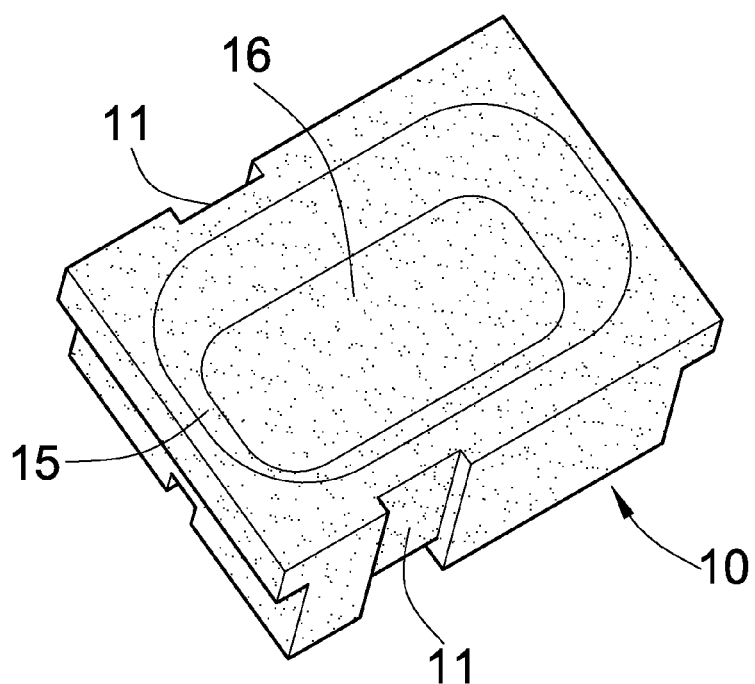
FIG. 4 is a prospective view of the base according to the present invention.
Figure 5:
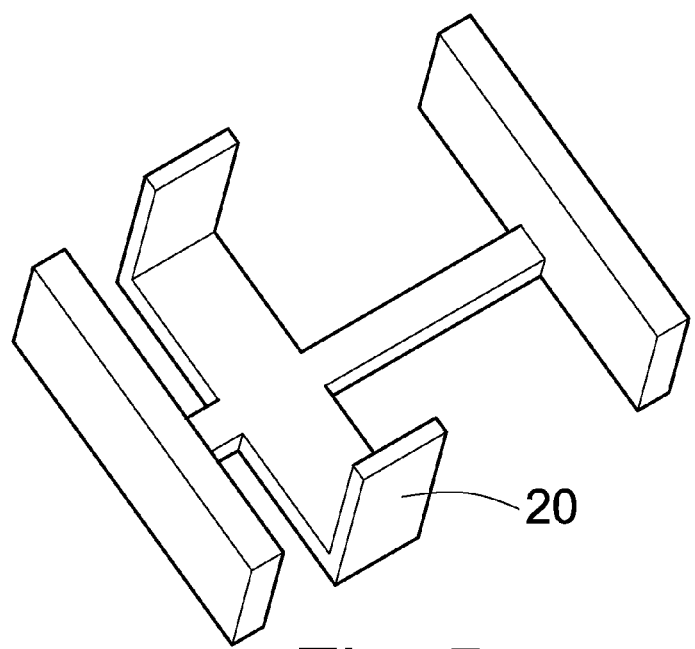
FIG. 5 is a prospective view of the carrier according to the present invention.

Step S1 is performed by precision machining to form a two-shot mold. An electrically conductive base 10 is made of a metal catalyst or its organic substances doping material, which is helpful to perform electroplating such that the base 10 is ready as a precatalyzed metal catalyst or other organic substance containing plastic material. The metal catalyst and its organic substance include Pd, Cu, Ag, which serve to form an interface layer 30 (see FIG. 4) on the base 10 afterwards. A carrier 20 made of a non-metallic catalyst or other organic substance is affixed firmly with the aforesaid plastic material (see FIG. 5). The carrier 20 is made of a plastic material with a surface comparatively uneasy to be electroplated, or made of a plastic material, which does not contain a metal catalyst or its organic substance. After bonding with each other, the surface of the base 10 is etched, activated and metalized. The plastic material used for the base 10 and carrier 20 may be selected one of the high temperature resisting plastic materials (higher than 260° C.) to meet the IR Reflow requirement. A reflection surface 15 (reflection cup) is formed on the base 10 by molding. The inclined angle of the reflection surface 15 can be optionally determined at the range of 15° to 85° formed between the top surface of the base 10 and the reflection surface 15. 15° is usually selected for requirements of various light emissions. For improving the lighting efficiency of LED, the plastic material is essentially selected one form Polyamide (PA), PBT, PET, LCP, PC, ABS, and PC/ABS.

Figure 6:
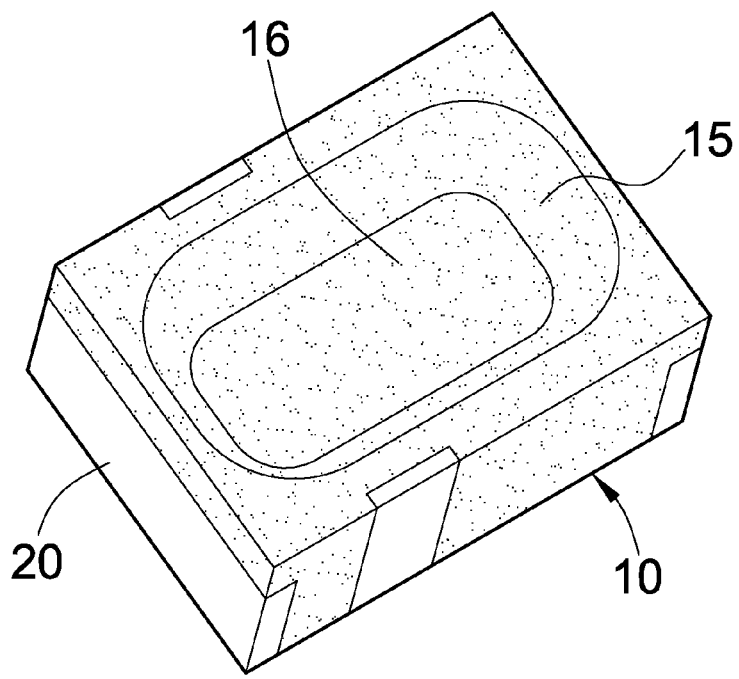
FIG. 6 is a prospective view of the lead frame of the present invention after completing the two-shot molding.
Figure 7:
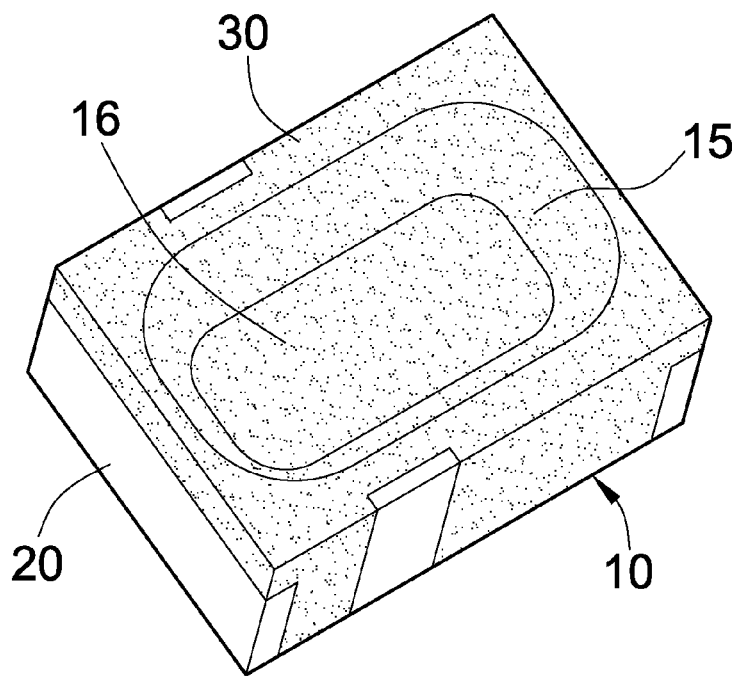
FIG. 7 is a prospective view of the lead frame of the present invention after completing the chemical deposition.

Step S2 is performed after finishing a fundamental material for the lead frame in S1 (see FIG. 6). A pretreatment of non-electrolyzed plating bath is carried out using the chemical solution to activate part of the surface to be electroplated. With step S2 an interface layer 30 may be formed on the electroplatable surface of the base 10 on where Ni or Cu is able to grow (see FIG. 7) that is helpful to enhance bonding strength between the interface layer 30 and the base 10.

Figure 8:
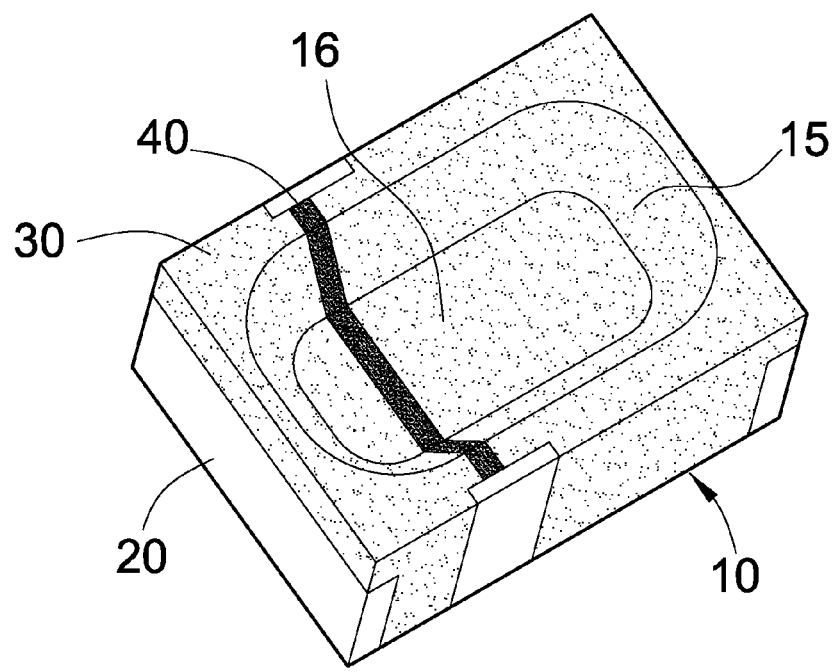
FIG. 8 is an illustrative view showing an insulation route is formed by ablating part of the interface layer employing laser beam radiation.

Step S3 is performed after finishing chemical deposition treatment on the interface layer 30. A very fine pattern of insulation route is formed on the interface layer 30 by ablating part of its surface with laser beam radiation (see FIG. 8). The wavelength of the laser beam is selected one among 248 nm, 308 nm, 532 nm 1064 nm and 10600 nm. The laser source may be selected one from $CO^2$ laser, Nd:YAG laser, doped Nd:YV04 crystal laser and excimer laser. Afterwards the desired insulation route 40 on the interface layer 30 is obtained according to the actual requirement.

Figure 9:
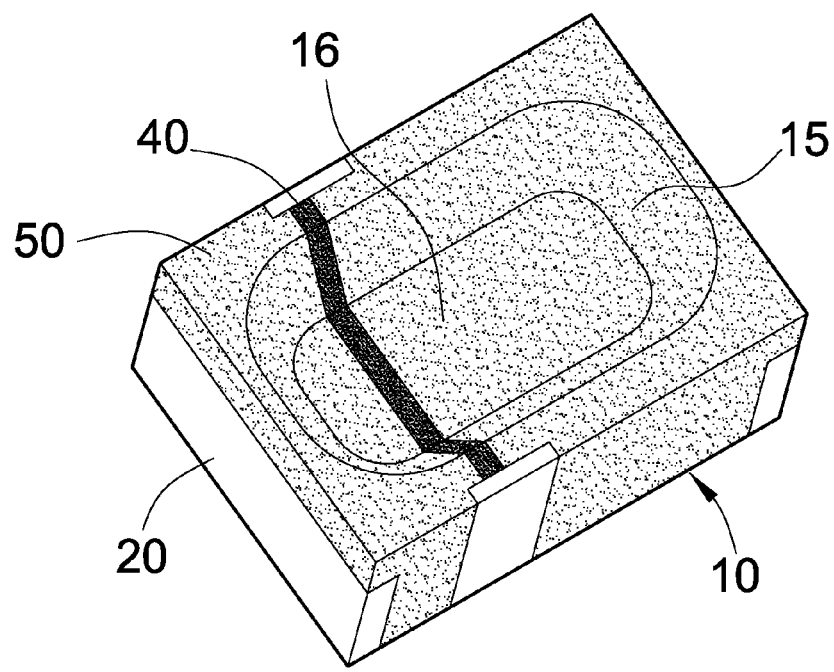
FIG. 9 is a prospective view of the lead frame of the present invention after completing the electroplating.

In step S4, electroplating process is carried out using the materials selected one from Cu, Ni, Ag, Au, Cr, chemical replacement Au to form a metal layer 50 (see FIG. 9). This part is to be used to affix the light source chips and layout the wiring connection, and maintains a high reflectivity and good electrical conductivity as well. The fabrication of a plastic lead frame for LED is thus completed.

Figure 3:
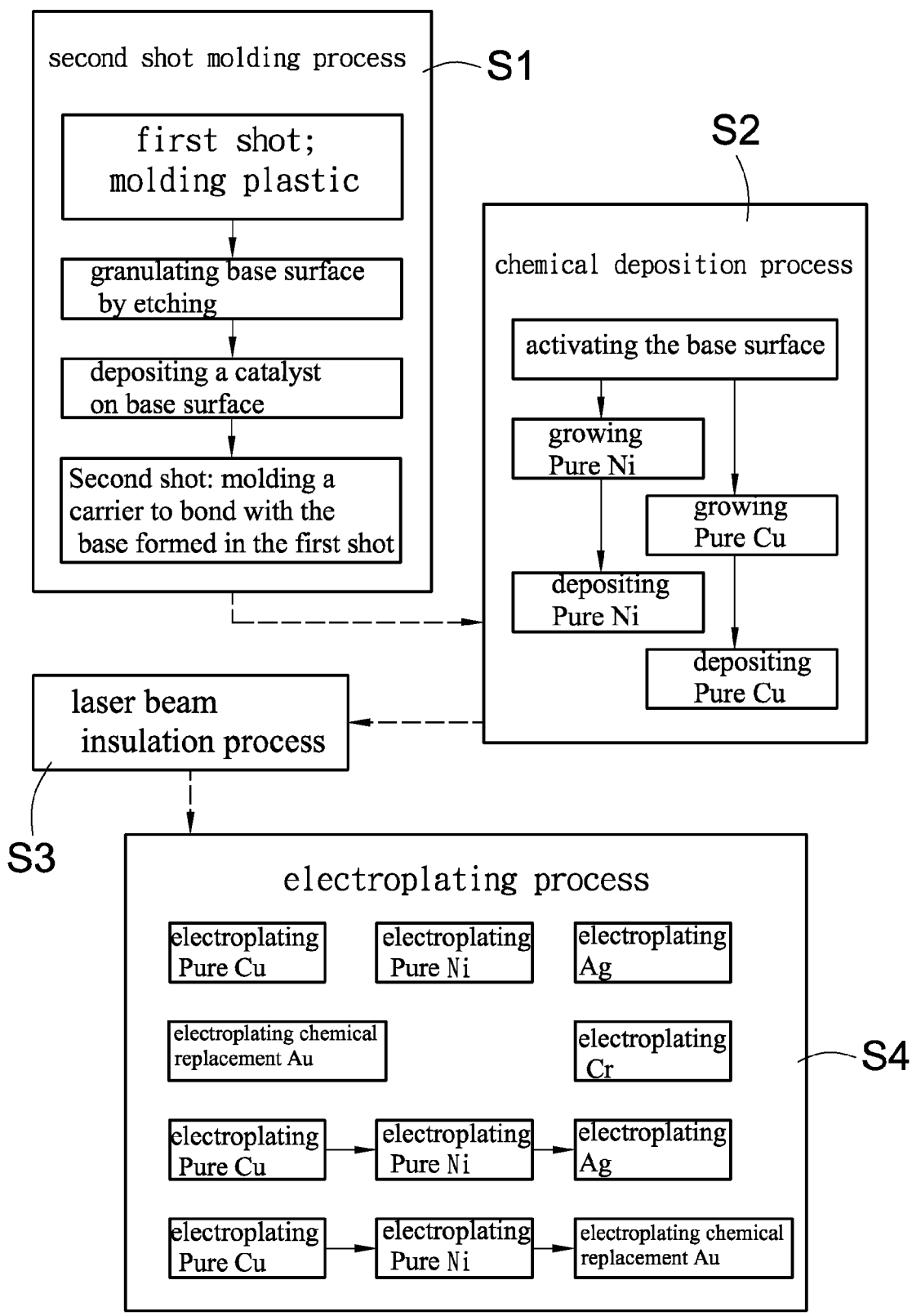

In another embodiment of fabrication method for a plastic lead frame shown in FIG. 3, the two shot molding conducted in step S1 is replaced by second shot plating and laser (SSPL) process, and successively followed by steps of chemical deposition S2, insulation route forming by laser beam radiation S3 and electroplating S4 in order. In the present invention, the fabrication method performed in this embodiment is defined as SSPL as described above.

In SSPL process, a single plastic material is used to mold the base 10 (see FIG. 4), after formation of the base 10; the surface thereof is etched and coated with a catalyst uniformly. After that, the similar SSPL process forms a reflection surface 15, and exposing the conductor surface where a metallic layer is to be deposited. Then successively followed by steps of S2, S3 and S4 in order to produce a lead frame for LEDS.

In this fabrication method, the plastic element molded at first is for affixing the LED dies, wire connection, formation of the reflection surface 15, deposition of the interface layer 30 and forming the insulation route with laser radiation, and then providing a large area heat dissipation structure by connecting the reflection surface 15 with the interface layer 30. While the plastic element molded in the second time is for bonding with the insulation route, which is previously formed, in step S3 so as to make up a perfect insulation structure. This is the kernel showing the outstanding characteristic or the present invention.

Many changes and modifications in the above-described embodiments of the invention can, of course, be carried out without departing from the scope thereof. Accordingly, to promote the progress in science and the useful arts, the invention is disclosed and is intended to be limited only by the scope of the appended claims.

What is claimed is:

1. A fabrication method for a plastic lead frame with reflection and conduction metal layer, comprising the steps:
    a two shot molding step: forming a base made of a doped metal catalyst containing or an organic substance containing plastic material, and forming a carrier from a non-metal catalyst or organic substance plastic material to be affixed to said base; then forming a slanted reflection surface downwardly on top of said base so as to prepare a fundamental material for said lead frame;
    a chemical deposition step: performing chemical bath pretreatment by activating the surface of said base, and then forming an interface layer with chemical deposition;
    a laser insulation treatment step: forming an insulation route on said interface layer by ablating part of the surface of said interface layer; and
    an electroplating process step: forming a metallic layer on said interface layer after forming the insulation route with laser beam radiation.

2. The method of claim 1, wherein the angle formed between the top surface of said base and said reflection surface is at the range of 15°~85°.

3. The method of claim 1, wherein said chemical deposition process grows nickel or copper on the surface of said base so as to form said interface layer.

4. The method of claim 1, wherein the material used for electroplating to form said metallic layer is one selected from Cu, Ni, Ag, Au, Cr, and chemical replacement Au.

5. The method of claim 1, wherein the source of the laser beam used in the laser insulation process is selected one form $CO^2$ laser, Nd: YAG laser, doped Nd:YVO4 crystal laser and excimer laser.

6. A fabrication method for a plastic lead frame with reflection and conduction metal layer, comprising the steps:
    a second shot molding step: molding a base with a single plastic material, etching the surface thereof to uniformly coat a catalyst on the surface, next using the same plastic material to form a carrier, and forming a slanted reflection surface downwardly on top of said base thereby preparing a fundamental material for said lead frame;
    a chemical deposition step: performing chemical bath pretreatment by activating the surface of said base, and then forming an interface layer with chemical deposition;
    a laser insulation treatment step: forming an insulation route on said interface layer by ablating part of the surface of said interface layer; and
    an electroplating process step: forming a metallic layer on said interface layer after forming the insulation route with electroplating.

7. The method of claim 6, wherein the angle formed between the top surface of said base and said reflection surface is at the range of 15°~85°.

8. The method of claim 6, wherein said chemical deposition process grows nickel or copper on the surface of said base so as to form said interface layer.

9. The method of claim 6, wherein the material used for electroplating to form said metallic layer is one selected from Cu, Ni, Ag, Au, Cr, and chemical replacement Au.

10. The method of claim 6, wherein the source of the laser beam used in the laser insulation process is selected one form $CO^2$ laser, Nd: YAG laser, doped Nd:YVO4 crystal laser and excimer laser.

* * * * *